United States Patent [19]
Gates et al.

[11] Patent Number: 5,830,538
[45] Date of Patent: Nov. 3, 1998

[54] METHOD TO FORM A POLYCRYSTALLINE FILM ON A SUBSTRATE

[75] Inventors: Stephen McConnell Gates; James Richard Heath, both of Ossining, N.Y.

[73] Assignee: International Business Machines Corporation, Armonk, N.Y.

[21] Appl. No.: 641,950

[22] Filed: May 2, 1996

Related U.S. Application Data

[63] Continuation of Ser. No. 173,445, Dec. 23, 1993, abandoned.

[51] Int. Cl.[6] .............................. B05D 3/06; C23C 16/22
[52] U.S. Cl. ..................... 427/535; 427/553; 427/574; 427/578; 427/248.1; 427/249
[58] Field of Search ...................... 427/535, 553, 427/574, 578, 569, 248.1, 249; 437/233

[56] References Cited

U.S. PATENT DOCUMENTS

| | | |
|---|---|---|
| 4,579,750 | 4/1986 | Bowen et al. . |
| 4,626,449 | 12/1986 | Hirai et al. . |
| 4,694,777 | 9/1987 | Roche . |
| 4,719,122 | 1/1988 | Yamazaki . |
| 4,784,963 | 11/1988 | Krimmel et al. . |
| 4,843,030 | 6/1989 | Eden et al. . |
| 4,940,505 | 7/1990 | Schachameyer et al. . |
| 4,952,521 | 8/1990 | Goto ......................................... 437/33 |
| 5,082,359 | 1/1992 | Kirkpatrick ............................ 359/642 |
| 5,112,647 | 5/1992 | Takabayashi . |
| 5,254,481 | 10/1993 | Nishida ..................................... 437/4 |
| 5,264,070 | 11/1993 | Urguhart et al. ........................ 156/603 |
| 5,298,286 | 3/1994 | Yang et al. ............................... 427/249 |

FOREIGN PATENT DOCUMENTS

| | | |
|---|---|---|
| 04-80943 | 3/1992 | Japan . |
| 05-82441 | 4/1993 | Japan . |

OTHER PUBLICATIONS

Heath et al, Appl. Phys. Lett. 64(26) pP. 3569–3571 (1994).
Pierson, "Handbook of Chemical Vapor Deposition", Noyes Publications (1992) pp.102 and 184, pp. 208–209.
J.M. Jasinski et al., "Photochemical Preparation of Crystalline Silicon Nanoclusters" Chem. Mater. 1991, 3, 989–992.
M. Meunier et al. "Laser–Induced Chemical Vapor Deposition of Hydrogenated Amorphous . . . " J. Appl. Phys. 62 (7), 1 Oct. 1987 pp. 2812–2821.
K. Suzuki et al. "Laser–Assisted Chemical Vapor Deposition of Si: Low–Temperature . . . " J. Appl. Phys., vol. 58, No. 2, 15 Jul. 1985 pp. 979–982.
H. Takagi et al. "Quantum Size Effects on Photoluminescence in Ultrafine Si Particles" Appl. Phys. Lett. 56 (24), 11 Jun. 1990 pp. 2379–2380.
J.M. Jasinski et al. "Excimer Laser Photodissociation Studies of Disilane at 193 nm" Mat. Res. Soc. Symp. Proc. vol. 131, pp. 487–493.
T.R. Dietrich et al. "ARF Laser CVD of Hydrogenated Amorphous Silicon: the Role of . . . " Appl. Phys. A 48, 405–414 (1989) pp. 405–414.

(List continued on next page.)

Primary Examiner—Roy V. King
Attorney, Agent, or Firm—Daniel P. Morris

[57] ABSTRACT

A semiconductor processing method is provided for growing a polycrystalline film by preferably chemical vapor deposition (CVD) from a suitable precursor gas or gases on a substrate which has been coated with seeds, preferably of nanocrystal size, of the semiconductor material. The structure of the nanocrystal seeds (not the substrate) serves as a template for the structure of the final polycrystalline film. The density of the seeds and the thickness of the grown polycrystalline film determine the grain size of the polycrystalline film at the surface of said film. Epitaxial CVD onto the seeds to produce the polycrystalline film avoids the recrystallization step generally necessary for the formation of a polycrystalline film, and thus allows for the growth of polycrystalline films at reduced temperatures.

31 Claims, 9 Drawing Sheets

OTHER PUBLICATIONS

S. Furukawa et al. "Quantum Size Effects on the Optical Band Gap of Microcrystalline . . . " Physical Review B, vol. 38, No. 8, 15 Sep. 1988 pp. 5726–5729.

K.K. King et al. "Laser Photochemical Vapor Deposition of GE Films . . . " Mat. Res. Soc. Symp. Proc. vol. 75 pp. 189–194.

R.D. Coombe et al. "UV Laser–Induced Deposition of Metal Films" Appl. Phys. Lett. 37(9), 1 Nov. 1980, pp. 846–848.

D.M. Zehner et al. "Preparation of Atomically Clean Silicon Surfaces by Pulsed Laser . . . " Appl. Phys. Lett. 36(1), 1 Jan. 1980 pp. 56–59.

R.W. Andreatta et al. "Low–Temperature Growth of Polycrystalline Si and Ge Films By . . . " Appl. Phys. Lett. 40(2), 15 Jan. 1982 pp. 183–185.

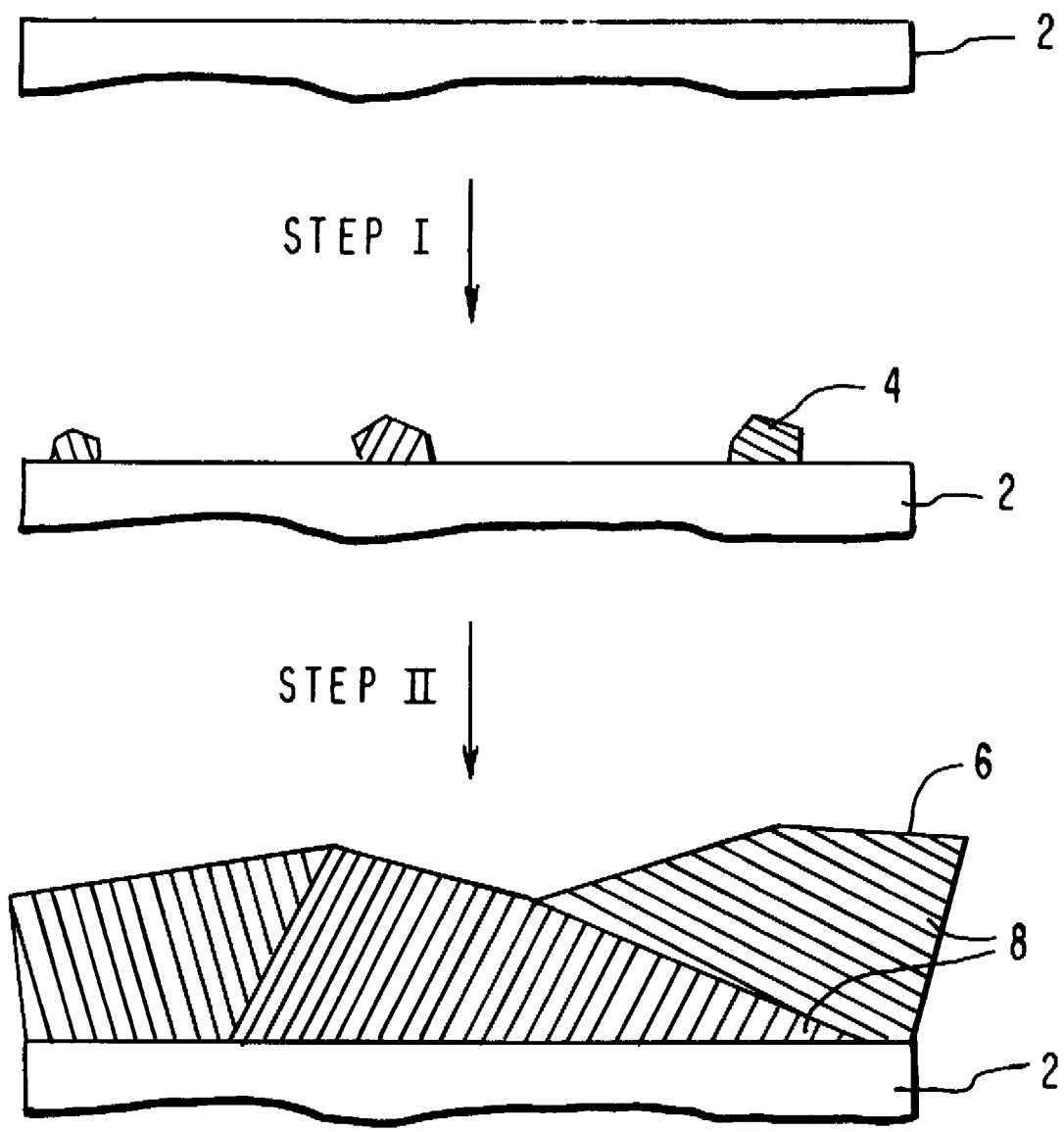

FIG. 6
6.1
Nanocrystal Seeds At High Coverage.
0.1 micron Grains
(Image: 1 micron square)
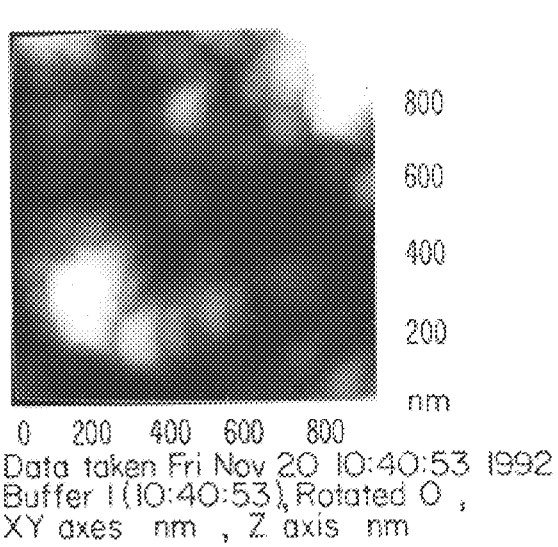
Data taken Fri Nov 20 10:40:53 1992
Buffer 1 (10:40:53), Rotated 0,
XY axes nm, Z axis nm
AFM data
Nanoscope II Parameters:
Z        90.0 A/V
XY      275.4 A/V
Samples  400 scan
6.2
Nanocrystal Seeds At Low Coverage.
1 micron Grains
(Image: 4 micron square)
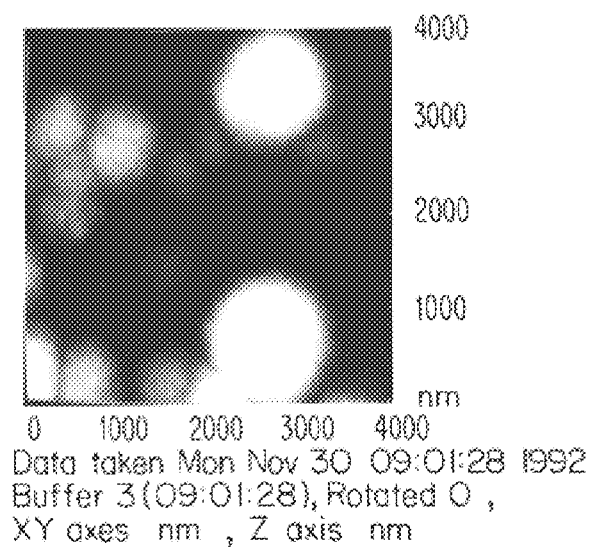
Data taken Mon Nov 30 09:01:28 1992
Buffer 3 (09:01:28), Rotated 0,
XY axes nm, Z axis nm
AFM data
Nanoscope II Parameters:
Z        90.0 A/V
XY      291.6 A/V
Samples  400 scan FILM GROWTH GATE = F (SEED COVERAGE)
PLOT OF POLY-Si FILM GROWTH RATE VS. NC SEED COVERAGE
T = 540° C

METHOD TO FORM A POLYCRYSTALLINE FILM ON A SUBSTRATE

This is a continuation of application Ser. No. 08/173,445, filed Dec. 23, 1993, now abandoned.

FIELD OF THE INVENTION

The present invention relates to forming a layer of polycrystalline material on a surface of a substrate. More particularly, the surface is seeded with particles on which the polycrystalline layer is grown from an atmosphere in which the substrate is placed.

BACKGROUND OF THE INVENTION

The invention relates to a processing technique for growth of a polycrystalline film on a substrate, preferably for growth of a polycrystalline semiconductor film on a substrate. This invention addresses the problems in polycrystalline semiconductor processing. In many instances, it is desirable to grow a polycrystalline semiconductor film on a substrate which is thermally incompatible with the standard growth processes for said film. For example, polycrystalline Si CVD typically requires temperatures in excess of 600° C. A desirable substrate for the support of a polycrystalline Si thin film is glass, which is incompatible with temperatures above 580° C. Glass typically melts or decomposes at temperatures above 580° C. Typically the electrical properties of a polycrystalline semiconductor film are determined by the grain size and grain boundaries of the film. A process for growing a polycrystalline semiconductor film which lends control over the grain size of said film is desirable. In the case of some materials, e.g. SiC, useful to practice the present invention there are a number of possible crystal structures, and very little is known about for growing a polycrystalline film of a given crystal structure.

Prior art which addresses the problem of growing a polycrystalline semiconductor film on a substrate which is thermally incompatible with the standard film growth process have typically relied upon techniques which provide for local heating of the substrate in the region of film growth while not heating the substrate bulk. Suzuki, Lubben and Greene[1] have shown that Si CVD on an amorphous $SiO_2$ substrate below 580° C. produces an amorphous Si film. However, if a pulsed UV laser is directed at the substrate during film growth, polycrystalline Si is grown at temperatures as low as 535° C. This process is an in situ laser annealing (ISLA) process. It is difficult to adapt this process toward growing a film on a large substrate, as high laser powers (>100 mJ/cm$^2$) are required, implying that many lasers would be necessary to continuously illuminate even a moderate sized substrate with energy sufficient to achieve polycrystalline film growth. Conversely, it is possible to grow an amorphous semiconductor film at low temperatures, and then laser anneal that film to make it polycrystalline. This process, referred to as post laser-annealing (PLA), has been performed, for the case of Si, with pulsed[2] and CW[3,4] laser sources. However, reports of substrate damage[3], small grain sizes[4], or film thickness constraints place severe limitations on PLA. No single ISLA or PLA technique has been demonstrated capable of yielding a broad control over grain size.

1. K. Suzuki, D. Lubben, and J. E. Greene, J. Appl. Phys. v.58, 979 (1985).
2. F. Morin, et al., J. Appl. Phys. v.53, 3897 (1982).
3. R. A. Lemons, et al., Appl. Phys. Lett. v.40, 469 (1982).
4. G. Auvert, Appl. Phys. Lett. v.38, 613 (1981).

The SiC crystal system is characterized by a number of crystal morphologies, of which the most common are 3-C (cubic) and 6-H (hexagonal). SiC thin films are typically grown by exposing a clean Si wafer to a carbon containing CVD gas (acetylene, for example) to carbonize the top few surface layers, forming either the 3-C or the 6-H structure, depending on the carbonization temperature. The carbonized wafer surface, then, provides a template for the epitaxial CVD of single crystal SiC. For polycrystalline SiC, the above process may be carried out on polycrystalline Si film rather than a single crystal Si wafer. Typical CVD temperatures are well above 1000° C. Ohshita[5] has shown that the use of the CVD gas mixture $SiH_2Cl_2/C_3H_8/HCl/H_2$ may be adjusted to allow for the growth of 3-C SiC films at temperatures as low as 900° C., although those films contain a large number of crystalline Si precipitates. This process requires the presence of a clean Si or polysilicon surface. Neither ISLA nor PLA investigations have been taught for the polycrystalline SiC system.

5. Y. Ohshita, Mat. Res. Soc. Symp. Proc. v.162, 433 (1990).

The current invention involves coating a desired substrate with a subscribed amount of nanocrystals. The nanocrystals serve as nuclei for seeding the growth of a polycrystalline film. Said film grows epitaxially onto the surfaces of the nanocrystals. The current invention solves several problems relevant to the art:

(1) A polycrystalline film may be grown at reduced temperatures. The nanocrystals are typically deposited onto the substrate at room temperature, and the substrate is then heated in the presence of CVD precursor(s). The presence of nanocrystals on the substrate surface implies that the nucleation step in polycrystalline film growth is avoided, thereby reducing the film growth temperature. Utilizing this nanocrystal seeding technique, polycrystalline Si films may be readily grown at temperatures below 580° C., making this polycrystalline Si process compatible with growing films on glass. In a similar way, 6H-SiC films may be grown at temperatures as low as 800° C.

(2) Grain size within the polycrystalline film may be controlled. For the current invention, polycrystalline thin films are grown epitaxially onto nanocrystal seeds which are supported by a substrate. The grain size of the final polycrystalline film is determined by the density of nanocrystal seeds on the substrate.

(3) The requirements for the substrate which supports the polycrystalline film are relaxed. For this invention, the epitaxial growth occurs on the nanocrystal seeds, not on the substrate. Thus, glass is a suitable substrate for polysilicon growth; quartz, sapphire or Si are suitable substrates for polycrystalline SiC growth, etc.

BRIEF DESCRIPTION OF THE DRAWINGS

FIGS. 3A and 3B schematically illustrate polycrystalline film growth.

FIG. 6 shows the effect of changing the areal density of seeds on the final grain size.

SUMMARY

Figure 1A:
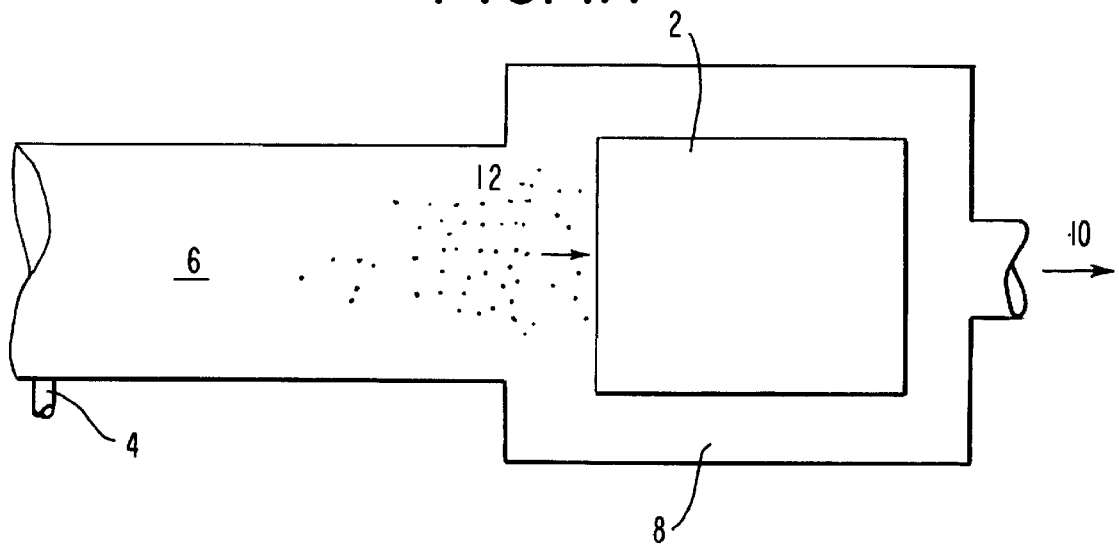
FIGS. 1A and 1B show the in line geometry for crystal seeding.

It is an object of the present invention to provide an improved process for depositing a polycrystalline film on a substrate.

It is another object of the present invention to provide a process wherein the polycrystalline film has a growth temperature less than the substrate on which it is formed.

It is yet another object of the present invention to form a polycrystalline layer on a substrate at a temperature less than the melting temperature of the substrate.

It is yet a further object of the present invention to provide a process for depositing the seeds at or below room temperature.

It is yet an additional object of the present invention to control the grain size of the polycrystalline layer.

It is yet a further object of the present invention to provide a reduced temperature process for forming a polycrystalline layer on a substrate surface.

It is yet another object of the present invention to provide a process wherein there is no necessary template relationship between the substrate and the polysilicone film.

A broad aspect of the present invention is a method for forming a polycrystalline layer on a surface by first seeding the surface with seeds containing crystalline material and exposing the surface to an atmosphere to grow on the seeds a polycrystalline layer of material.

A more particular aspect of the present invention concerns the polycrystalline layer which is composed of grains having a size which is controlled. Another more particular aspect of the present invention is a method of exposing a substrate to a photolytically or pyrolitically active particle-precursor gas in a vacuum-tight reaction chamber.

Another more particular aspect of the present invention is a method for forming a polycrystalline layer on a surface by first seeding the surface with seeds of crystalline material followed by subsequent exposure of said seeds to an atmosphere and temperature appropriate for growing epitaxially on the seeds until a complete polycrystalline film has been grown.

Another more particular aspect of the present invention is a method wherein a surface of a substrate is dusted with seed particles. These seeds may be produced in a suitable precursor gas via photo-, thermal-, or plasma-excitation of said gas. Preferably the particles are substantially crystalline. Bonds at the surfaces of the particles are preferably terminated chemically to be compatible with the subsequent CVD step. The seed particles preferably have dimensions in the range of from about 2 to about 30 nm. The coverage of the target surface of the substrate by seed particles is preferably in the range of from 0.01 to about 1 monolayer.

Another more particular aspect of the present invention is a method wherein the seeded surface is exposed to an atmosphere containing a material which epitaxially grows on the seeds to form crystalline grains which tend to grow together as the material is deposited to form the layer of polycrystalline material on the target surface.

In another more particular aspect of the present invention, the final grain size of the polycrystalline film tends to bear an inverse relation to the coverage of the silicon seed particles on the target surface.

DETAILED DESCRIPTION

A semiconductor processing method is provided for growing a polycrystalline film by preferably chemical vapor deposition (CVD) from a suitable precursor gas or gases on a substrate which has been coated with seeds, preferably of nanocrystal size, of the semiconductor material. The structure of the nanocrystal seeds (not the substrate) serves as a template for the structure of the final polycrystalline film. The density of the seeds and the thickness of the grown polycrystalline film determine the grain size of the polycrystalline film at the surface of said film. Epitaxial CVD onto the seeds to produce the polycrystalline film avoids the recrystallization step generally necessary for the formation of a polycrystalline film, and thus allows for the growth of polycrystalline films at reduced temperatures.

In accordance with the invention, a polycrystalline semiconductor film is grown on a substrate which has been previously coated with a film of seeds of said semiconductor. There is no correlation between the structure of the substrate and the structure of the film. The film is preferably the result of an epitaxial CVD process on the surface of the nanocrystals, with the nanocrystal structure serving as a template for the crystal structure of said film. In addition, the density of nanocrystal seeds on the substrate surface control the final grain size of the grown polycrystalline film. The presence of the crystal seeds on the substrate also lowers the temperature for growth of a polycrystalline film.

In accordance with the invention, preferably nanocrystals are used to seed the growth of a polycrystalline semiconductor film. The nanocrystals are made in a gas flow cell via a gas phase photolysis of a semiconductor containing molecule in a rare gas buffer. For the case of Si, the nanocrystal syntheses have been previously described by Murthy, et al., J. Cryst. Growth, v. 33, 1 (1976), (which describes a pyrolitic synthesis) Jasinski, et al., Chem. Mater. v. 3, 989 (1991) (which describes a photolytic synthesis) and Littau, et al., J. Phys. Chem., v. 97, 1224 (1993) (which describes a pyrolitic synthesis).

A pulsed ultra-violet laser (PUVL) is used to photolyse the precursor molecules into radicals and other transient molecular species. These molecular transients condense in the gas phase to form amorphous particles. As the amorphous particles traverse the flow cell, they absorb photons from subsequent pulses of the PUVL, and are annealed into nanocrystals of size range 2–30 nm. The particles are suspended in the inert buffer gas as an aerosol, and only slowly condense onto surfaces in the flow cell. If the gas flow is directed over a substrate, either by placing a substrate in the path of the gas flow cell, or by redirecting the aerosol over a substrate, particles will condense on the substrate. These are the nanocrystal seeds for seeding the growth of a polycrystalline film. The entire seeding process is temperature-independent, since the laser provides the energy for nanocrystal formation. Indeed, the seeding process is most easily carried out at room temperature. Conversely, it is possible to produce similar seeds via gas phase pyrolysis of the semiconductor containing molecule. Such a pyrolysis process does not involve a laser, but it does require elevated temperatures, although elevated temperatures in the region of the substrate are not necessary. By controlling the exposure time of the substrate to the nanocrystal aerosol, it is possible to control the density of nanocrystal seeds which condense onto the substrate.

After the substrate receives a coating of nanocrystal seeds, the substrate temperature is raised in the presence of an appropriate pressure of an appropriate semiconductor containing gas to facilitate a thermal CVD process for epitaxial growth onto the surface of the nanocrystal seeds. The temperature of this process is substantially lower than would be required to grow a polycrystalline film on the substrate in the absence of the nanocrystal seeds.

Nanocrystal Seeding for CVD Film Growth is conducted in two steps, I. Nanocrystal Seeding, and II) Thermal CVD Film Growth. Nanocrystal seeding for CVD has been conducted in 2 different geometries: 1. with the nanocrystal synthesis and the substrate arranged on one axis ("Inline Geometry") and 2. with the nanocrystal seeds transported as an aerosol into a separate growth chamber located at a 90° angle from nanocrystal synthesis ("Right Angle Geometry").

Figure 1B:
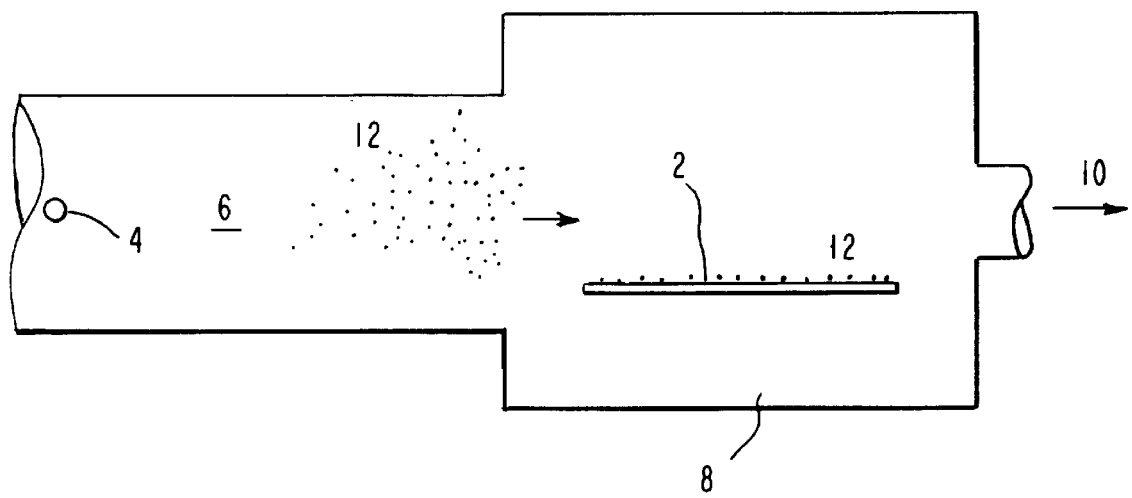

FIGS. 1A and 1B show the essential elements of the "Inline Geometry" for nanocrystal seeding. FIGS. 1A and 1B show top and side views, respectively, of substrate 2. The substrate 2 is placed in the chamber 8, and the precursor gas is admitted through inlet 4. To complete step I., the gas flow tube 6 is maintained at 10–20 torr total pressure with the precursor gas flow rate in the range 1–10 sccm and the buffer gas flow rate in the range 100–150 sccm. The gas flow direction is defined by the location of the pump out port 10. Within the synthesis tube 6, excitation of the precursor gas with thermal or radiative energy sufficient to dissociate the precursor leads to synthesis of Nanocrystal Seeds 12. The nanocrystal seeds flow towards the pump out port 10, and are transported across the substrate 2. A fraction of the Seeds form a non-adherent coating on the substrate. To complete step II., the chamber 8 is pumped out, the precursor gas is admitted to a suitable pressure, and the temperature of the substrate is raised to a temperature sufficient to promote thermal CVD of a polycrystalline film.

Figure 2A:
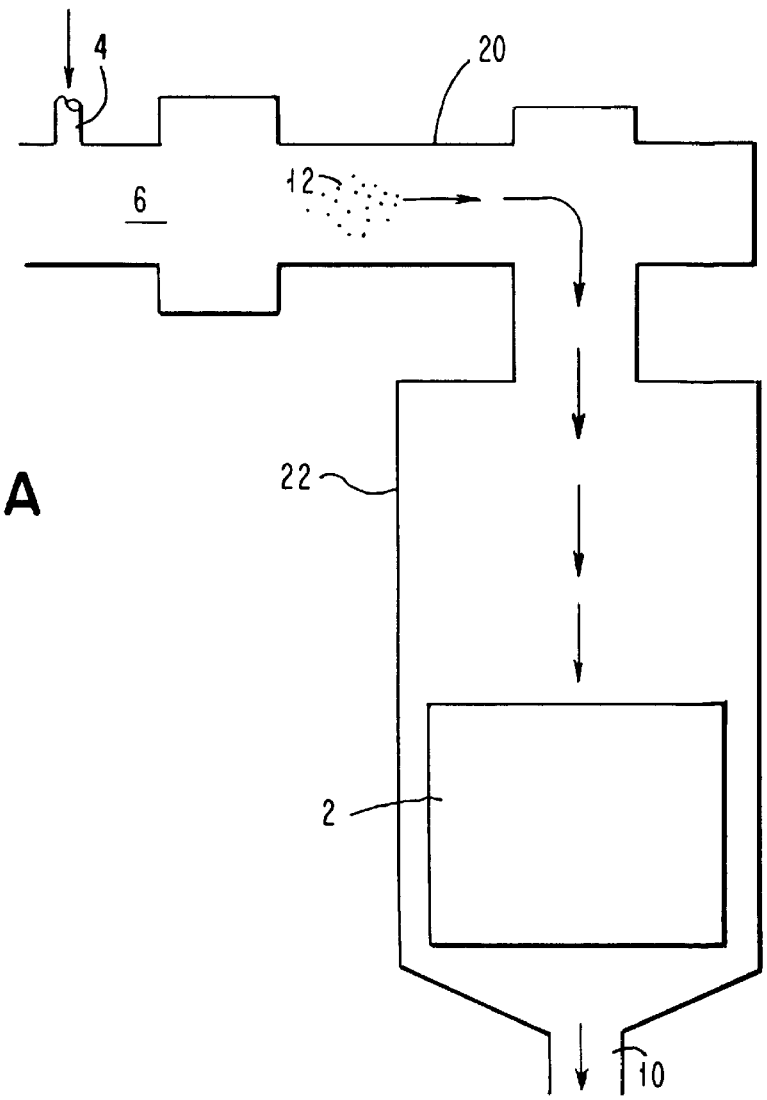
FIGS. 2A and 2B show the right angle geometry for crystal seeding.
Figure 2B:
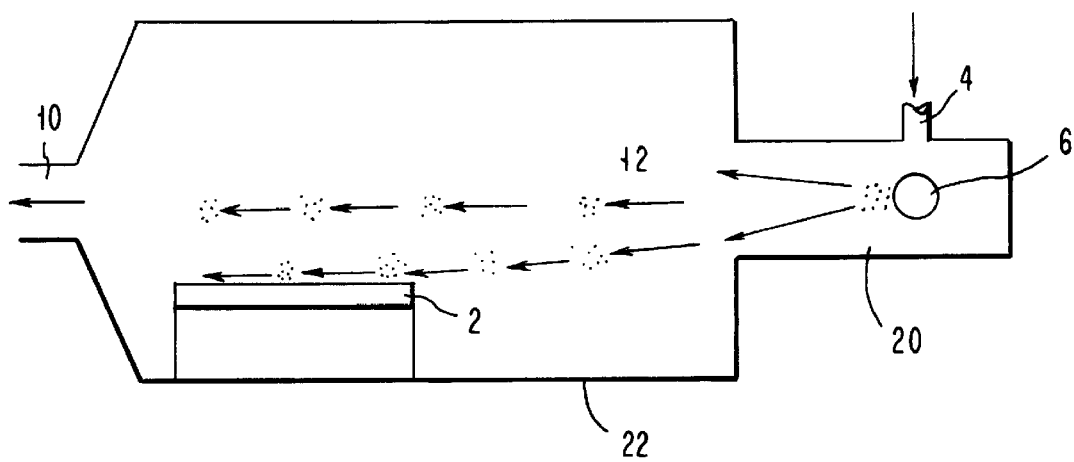

FIGS. 2A and 2B show the elements of a more preferred geometry for nanocrystal seeded deposition, the "Right Angle Geometry". FIGS. 2A and 2B show top and side views, respectively, of substrate 2. In FIGS. 2A and 2B the nanocrystal synthesis is located in chamber 20, the substrate 2 is located in chamber 22, and the nanocrystal seeds are transported as an aerosol via gas flow at pressure $\geq 10$ torr from chamber 20 to chamber 22. To complete step I., the substrate 2 is placed in chamber 22 and both chambers 20 and 22 are maintained at 10–20 torr total pressure with the precursor gas flow rate in the range 1–10 sccm and buffer gas flow rate in the range 100–150 sccm. The precursor and buffer gases are admitted through the inlet 4. The gas flow direction is defined by the location of the pump out port 10. Within the synthesis tube 6, excitation of the precursor gas with thermal or radiative energy sufficient to dissociate the precursor leads to synthesis of nanocrystal seeds 12. The nanocrystal seeds flow from chamber 20 into chamber 22 towards the pump out port 10, and are transported across the substrate 2. A fraction of the seeds 12 form a non-adherent coating on the substrate. To complete step II., chamber 22 is pumped out, the precursor gas is admitted to a pressure, from 0.001 to 0.0001 Torr, and the temperature of the substrate 2 is raised to a temperature sufficient to promote thermal CVD of a polycrystalline film. For example, to grow a polycrystalline silicon film, said precursor gas may be $SiH_4$, and said temperature may be 565° C.

Figure 3B:
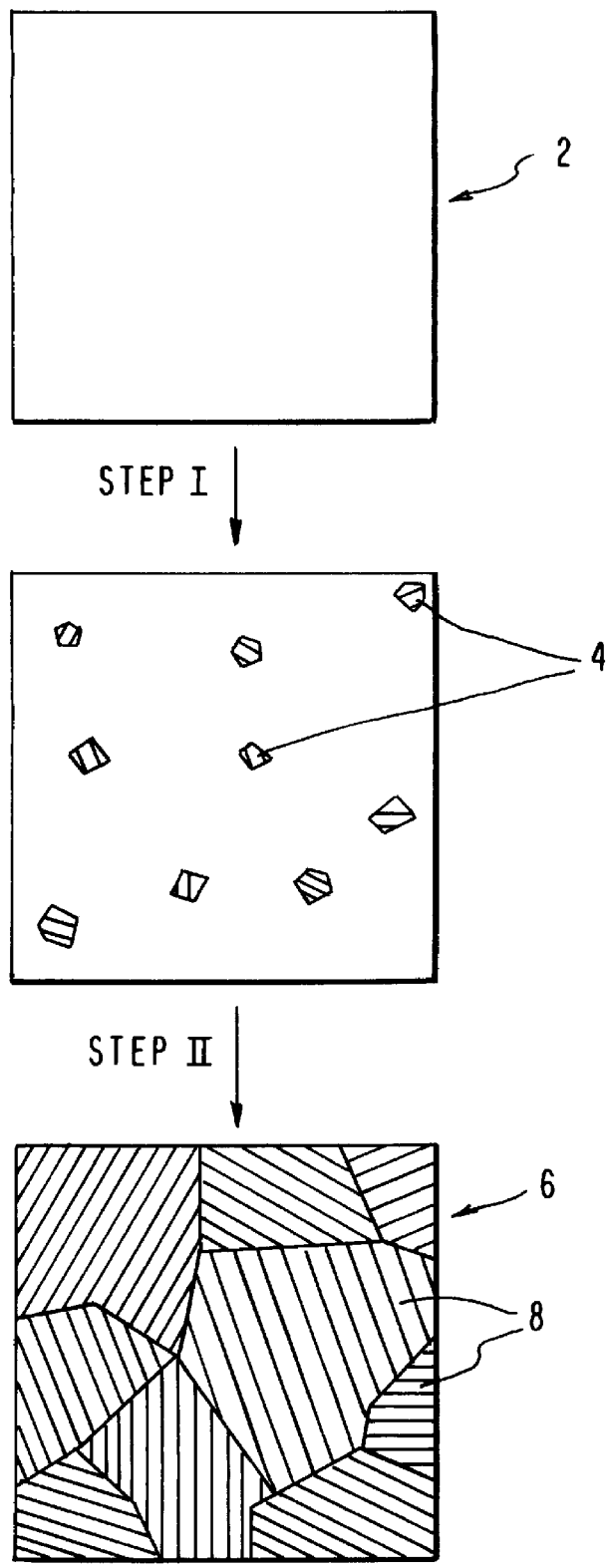

FIGS. 3A and 3B schematically illustrate the growth of a polycrystalline film via nanocrystal seeded deposition. FIGS. 3A and 3B show side and top views, respectively, of substrate 2. The clean amorphous substrate 2 is coated with a non-adherent coating of nanocrystal seeds 4 in Step I. In Step II, the nanocrystal seeds 4 grow into grains 8, which coalesce to form a Polycrystalline Film (6). The areal density of nanocrystal seeds 4 coated in Step I determines the maximum size of the grains 8 which form in Step II.

Two samples of polycrystalline silicon film having a grain size of roughly 0.1 $\mu$m on the one hand and roughly 0.5–1.0 $\mu$m on the other have been produced by two preferred embodiments of the process of the invention disclosure which differed essentially only in the coverage of the silicon seed particles on the target surfaces.

GROWTH OF POLYCRYSTALLINE SI FILMS

Figure 4:
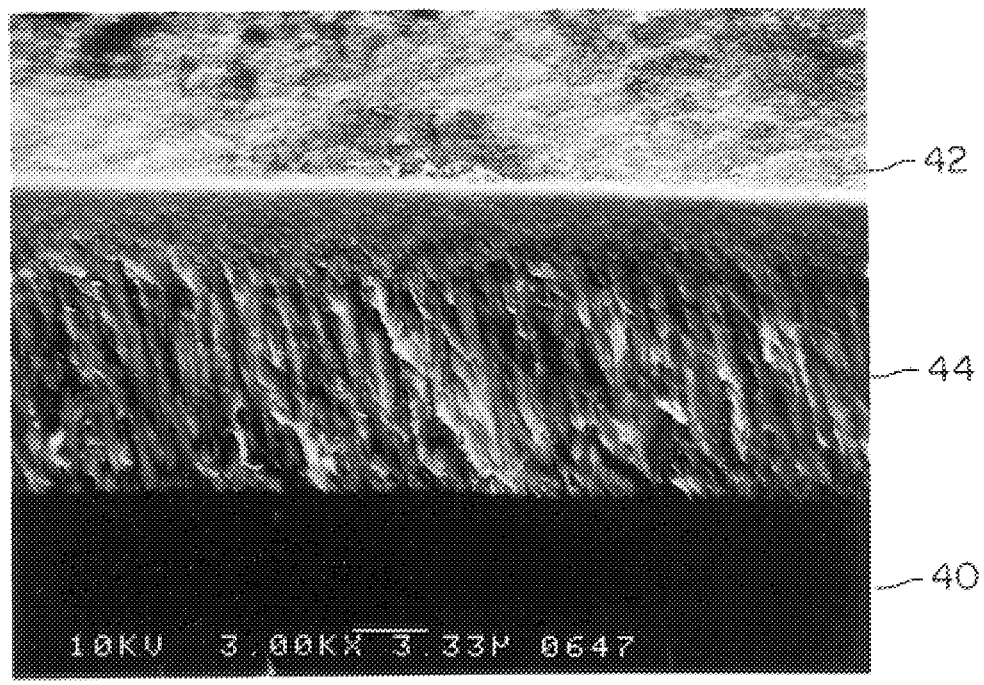
FIG. 4 is an SEM of the cleaved edge of a polycrystalline film grown according to the present invention.

FIG. 4 is a scanning electron microscope (SEM) image of the cleaved edge of a poly-Si film grown by the nanocrystal seeding technique at 540° C. The dark region 40 at the bottom is the crystal Si substrate, with a narrow black band defining the top of the substrate. This band is an $SiO_2$ film of 0.06 micron thickness. The white line 42 near the top of the figure is the top surface of the film. The gray, textured region 44 in the center is the Ploy-Si film, of about 10 microns thickness. Vertical grain structure, characteristic of Poly-Si films, is clearly seen in the center of FIG. 4.

Figure 5:
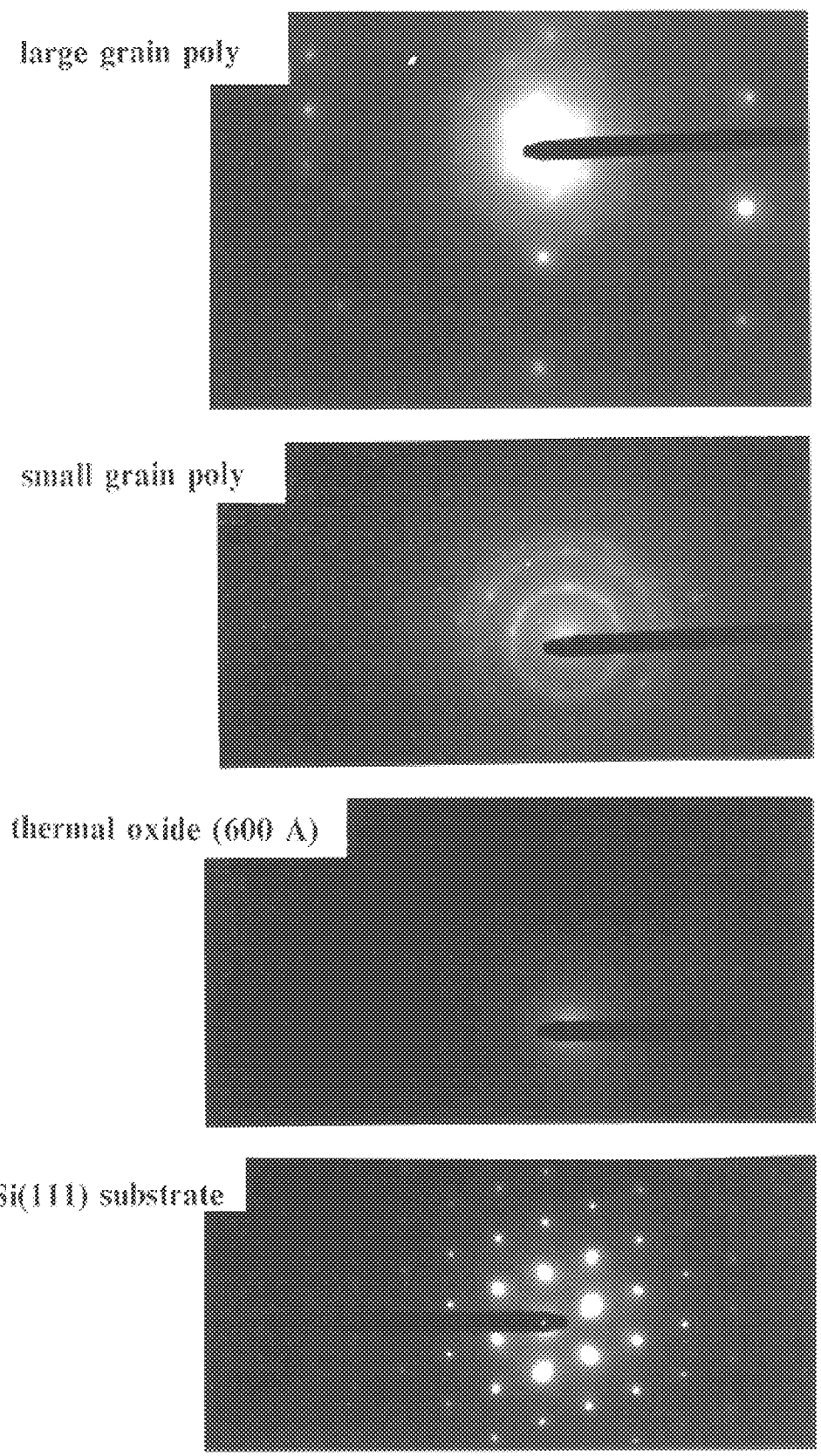
FIG. 5 shows selected area diffraction patterns from a layered structure which is shown in FIG. 4.

FIG. 5 shows a series of selected area diffraction (SAD) patterns collected in a transmission electron microscope (TEM) from a thinned cross-section of a specimen with a layer structure identical to FIG. 4. The diffraction pattern at the bottom is from the crystal Si substrate. The control pattern with no diffraction spots is from the amorphous $SiO_2$ layer (0.06 micron thick). Above this is the ring diffraction pattern from the small grain Poly-Si region adjacent to the $SiO_2$ substrate. At the top is the diffraction pattern from the large grain Poly-Si region near the top of the grown film. FIG. 5 confirms that the film grown is crystalline.

FIG. 6 demonstrates the effect of changing the areal density (coverage) of nanocrystal seeds on the final grain size of the Poly-Si film. In FIG. 6, two atomic force microscopy (AFM) images are shown of the top surfaces of two poly-Si films grown by the nanocrystal seeding technique at 540° C. In FIG. 6.1, the image size is 1×1 micron, the areal density of nanocrystal seeds was>100 micron $\mu2$, and the resulting grain size in the poly-Si film is on the order of$\cong 0.1$ micron. In FIG. 6.2, the image size is 4×4 micron, the areal density of nanocrystal seeds was$\cong 40$ micron $\mu2$, and the resulting grain size in the poly-Si film is on the order of$\cong 0.5$–1.0 micron.

Figure 7:
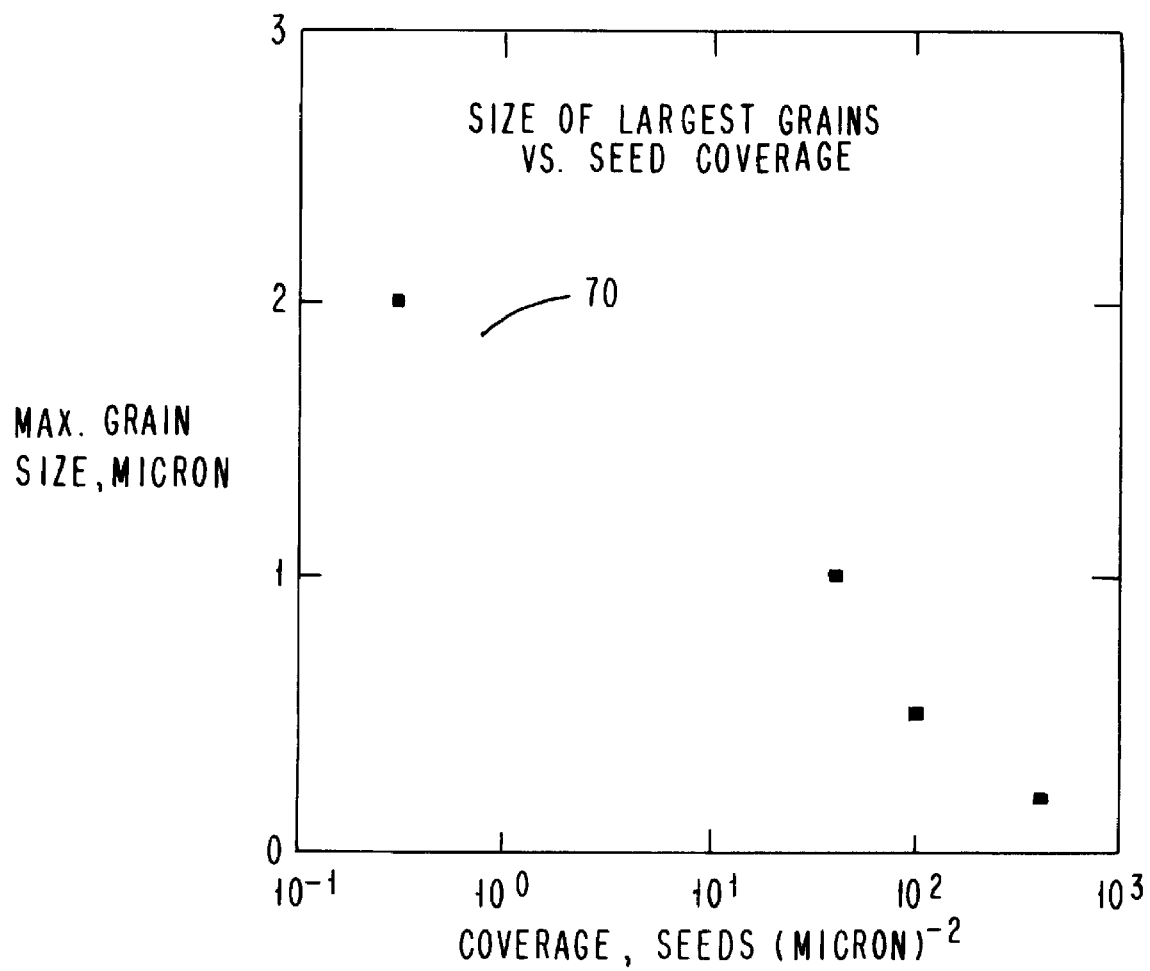
FIG. 7 shows the measured relationship between areal density and the maximum final grain size.

FIG. 7 summarizes the measured relationship between areal density (coverage) of nanocrystal seeds and the maximum final grain size of the poly-Si film. The grain size (ordinate) was measured by AFM or SEM. The areal density of nanocrystal seeds (abscissa) was measured by collection of the seeds on a carbon grid and observing the seed-to-seed spacing in the TEM. Line 70 which is an approximate fit to the data plated FIG. 7 has an approximate equation of max grain size in microns=2.33–1.07* log (number os seeds per microns squared).

Figure 8:
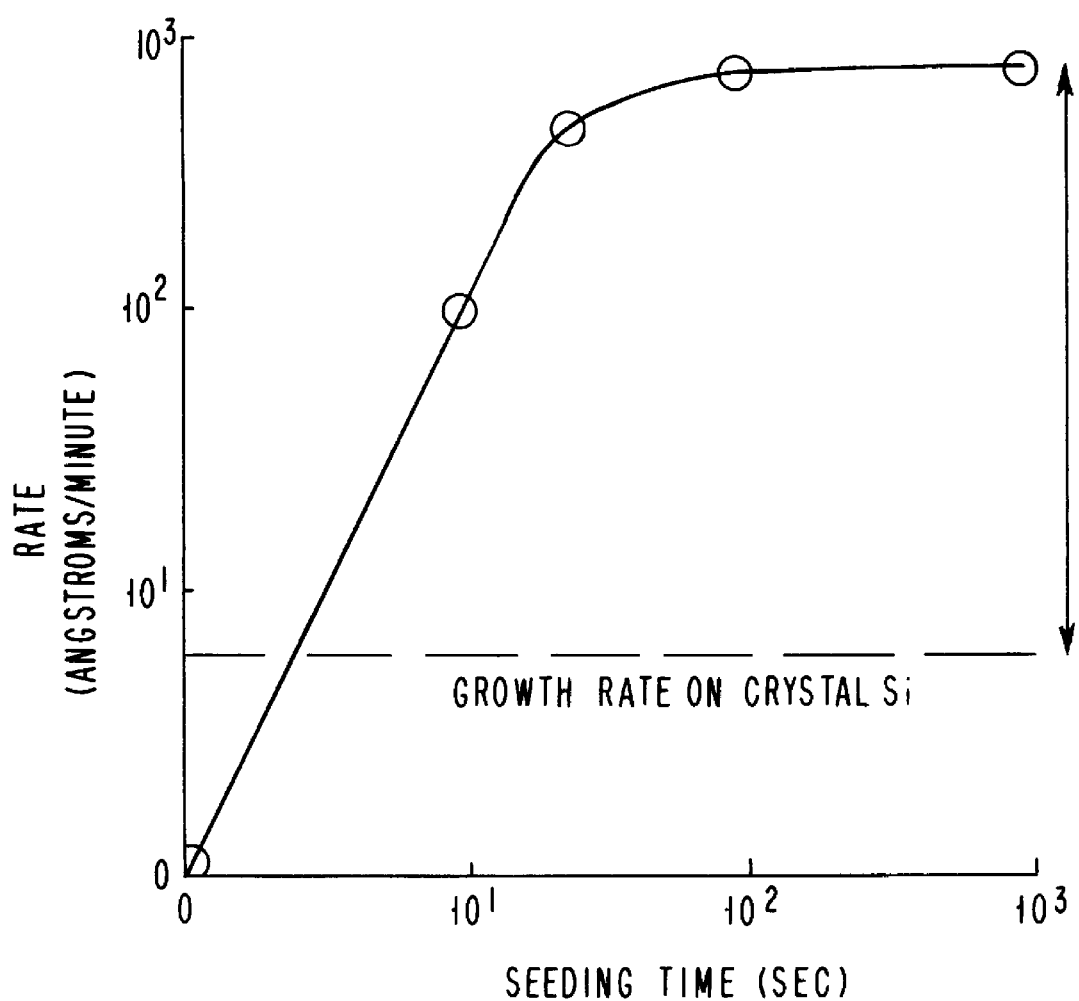
FIG. 8 shows the measured relationship between areal density of seeds and the growth rate of a poly-Si film.

FIG. 8 shows the measured relationship between areal density (coverage) of nanocrystal seeds and the growth rate of the poly-Si film. The growth rate (ordinate) is the film thickness divided by growth time. The film thickness was measured by dynamic secondary ion mass spectrometry (SIMS) depth profiling through the poly-Si layer into the substrate. The point at zero seeding time is a rigorous result of a control experiment in which no film grew in the absence of nanocrystal seeds. The growth rate on a Si(100) surface at 540° C. (J. Vac. Sci. Tech. A 10, p. 1846, 1992) is shown as a horizontal dashed line. The growth rate is enhanced up to 100 times (compared to the growth rate from $Si_2H_6$ on a crystal Si surface) by placing a large coverage of nanocrystal seeds on the substrate.

GROWTH OF POLY SILICON CARBIDE FILMS

Polycrystalline Silicon Carbide (SiC) films have been grown by the nanocrystal seeding technique on sapphire (crystal $Al_2O_3$) substrates at 800°–850° C. Nanocrystal seeds of SiC were synthesized using a mixture of acetylene ($C_2H_2$) and disilane $Si_2H_6$ as the precursor gases, in the ratio 4/1 $C_2H_2/Si_2H_6$. Table 1 is a summary of the d-spacings measured from diffraction patterns obtained by electron diffraction (ED) from the nanocrystal seeds, and a polycrystalline SiC film. For comparison purposes, the d-spacings of bulk β-SiC are presented. The diffraction patterns were obtained in different TEM instruments, so the diffraction patterns are not directly comparable. The nanocrystals are clearly of the β-form. Regarding the film d-spacings, the lowest diffraction ring of the data taken from the film is broadened, possibly indicative of the 6H-form of SiC. The β- and 6H-forms of SiC are very similar, and it is not possible to state whether the film is 6H or β. It is well known that β-SiC will serve as a template for growing epitaxial films of 6H- and/or β-SiC.{5} Thus, regardless of whether the film is of the β- or the 6H form of SiC, the β-SiC nanocrystals are serving as a template for the growth of polycrystalline SiC, and the substrate (sapphire) is NOT a structural template for the film.

TABLE 1

| β-SiC hkl | Bulk SiC d-spacing from literature bulk "d" | Nanocrystals Polycrystalline SiC Nanocrystal d-spacing nanoxtl "d" | SiC Film Poly-SiC Film d-spacing film "d" | |
|---|---|---|---|---|
| 111 | 2.511 | 2.505 | 2.56 | 2.64<br>2.50 = 6H form<br>2.37 interpretation |
| 220 | 1.549 | 1.543 | 1.52 | tion |
| 311 | 1.313 | 1.324 | 1.31 | |
| 400 | 1.089 | 1.086 | | |
| 331 | 1.000 | 1.002 | 0.98 | |
| 422 | 0.890 | 0.889 | | |

6H Epitaxy on β-SiC is possible. Whether film is 6H or β-form, the nanocrystals do serve as a template for growing polycrystalline Si-C. Crystals made w/ 20/5 acetyl/diSi ratio.

While the present invention has been shown and described with respect to specific embodiments, it will be understood that it is not thus limited. Numerous modifications, changes and improvements will occur which fall within the scope and spirit of the invention.

We claim:

1. A method comprising the steps of:
providing a substrate;
said substrate having a surface;
placing said substrate in a chamber having a first atmosphere and having an input part and an output part;
said substrate being unheated;
introducing at said input part a combination of a precursor gas and a buffer gas;
exposing said combination to an energy to dissociate said precursor gas to nanocrystals of seeds containing particles of a first material, said nanocrystals being suspended in a second atmosphere;
causing said nanocrystals to flow in a flow direction from said input port to said output port;
said substrate being disposed substantially parallel to said flow direction so that said nanocrystal seeds are transported over said surface of said substrate;
a fraction of said nanocrystal seeds being falled out from said second atmosphere onto said surface as said second atmosphere passes over said surface to form a seeded surface;
exposing said surface to said second atmosphere containing a second material
raising on said surface to an elevated temperature less than about 580° C. to grow crystallites of said second material on said seeds to form a polycrystalline layer of said second material on said surface.

2. A method according to claim 1 wherein said step of providing on said surface said crystalline seeds comprises:
exposing said surface to a second atmosphere containing constituents of said crystalline seeds; and
exposing said atmosphere to an energy to transform said constituents into said crystalline seeds.

3. A method according to claim 1 wherein said substrate has a substrate melting and/or softening temperature, and wherein there is a temperature suitable for epitaxial CVD on the seeds, and said epitaxial CVD temperature is less than said substrate melting and/or softening temperature.

4. A method according to claim 2 wherein step of exposing said atmosphere to an energy comprises exposing said atmosphere to an electromagnetic beam.

5. A method according to claim 2 wherein step of exposing said atmosphere to an energy comprises exposing said atmosphere to thermal energy.

6. A method according to claim 4 wherein said electromagnetic beam is a light beam.

7. A method according to claim 4 wherein said electromagnetic beam is a radio-frequency plasma source.

8. A method according to claim 1 wherein said seeds are formed from a precursor material.

9. A method according to claim 8 wherein said precursor material is selected from the group consisting of silanes, germanes and a combination thereof with hydrocarbons.

10. A method according to claim 2 wherein said second material is selected from the group consisting of silicon, germanium and silicon carbide.

11. A method according to claim 4 wherein said step of exposing said atmosphere to an energy is done at ambient temperature.

12. A method according to claim 4 wherein said second atmosphere is photolytically active.

13. A method according to claim 4 wherein said second atmosphere is activated in an RF or microwave plasma.

14. A method according to claim 5 wherein said second atmosphere is pyrolytically active.

15. A method according to claim 6 wherein said seeds are crystallized by irradiating said second atmosphere with photolysis-activation radiation.

16. A method according to claim 5 wherein said seeds are crystallized by thermal energy.

17. A method according to claim 7 wherein said seeds are crystallized by exposure to a plasma.

18. A method according to claim 2 wherein said seeds are single crystalline.

19. A method according to claim 1 wherein said seeds have dimensions in a range of from about 2 to about 30 nanometers.

20. A method according to claim 1 wherein coverage of said seeds on said surface is in a range of from about 0.01 to about 1 monolayer.

21. A method according to claim 1 wherein said first atmosphere is a chemical vapor deposition atmosphere.

22. A method according to claim 21 wherein said first atmosphere epitaxially deposits said second material on said seeds to form said polycrystalline layer.

23. A method according to claim 20 wherein said polycrystalline layer has grains having an average grain size, which has substantially an inverse relationship to said average coverage.

24. A method according to claim 1 wherein said seeds grow together as said material to form said polycrystalline layer.

25. A method according to claim 1, wherein said first material is the same as the second material.

26. A method according to claim 1, wherein said first material has a similar crystalline lattice to the second material.

27. A method according to claim 23, wherein said inverse relationship is approximately linear.

28. A method according to claim 8 wherein said precursor material is a germane and said seeds are of germanium seeds.

29. A method according to claim 8 wherein said precursor material is a silane hydrocarbon mixture and said seeds are silicon carbide seeds.

30. A method according to claim 8 wherein said precursor material is a silane and said seeds are silicon seeds.

31. A method according to claim 1, wherein said substrate is a glass.

* * * * *